(12) United States Patent
Dutta

(10) Patent No.: US 9,722,154 B2
(45) Date of Patent: Aug. 1, 2017

(54) FULL SPECTRUM SOLID STATE WHITE LIGHT SOURCE, METHOD FOR MANUFACTURING AND APPLICATIONS

(75) Inventor: Partha S. Dutta, Clifton Park, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 526 days.

(21) Appl. No.: 13/808,923

(22) PCT Filed: Jul. 19, 2011

(86) PCT No.: PCT/US2011/044412
§ 371 (c)(1),
(2), (4) Date: Jan. 8, 2013

(87) PCT Pub. No.: WO2012/012354
PCT Pub. Date: Jan. 26, 2012

(65) Prior Publication Data
US 2013/0113011 A1    May 9, 2013

Related U.S. Application Data

(60) Provisional application No. 61/399,890, filed on Jul. 19, 2010.

(51) Int. Cl.
*H01L 33/58* (2010.01)
*H01L 33/44* (2010.01)
(Continued)

(52) U.S. Cl.
CPC .......... *H01L 33/58* (2013.01); *C09K 11/7731* (2013.01); *H01L 33/005* (2013.01);
(Continued)

(58) Field of Classification Search
CPC ....... H01L 33/58; H01L 33/44; H01L 33/005; H01L 33/502; H01L 33/504; H01L 2933/0041; C09K 11/7768
(Continued)

(56) References Cited

U.S. PATENT DOCUMENTS 6,630,691 B1    10/2003 Mueller-Mach et al.
2004/0099206 A1*  5/2004 Ackermann et al. ............ 117/13
(Continued)

FOREIGN PATENT DOCUMENTS

EP    0 667 383 A2    8/1995
EP    1 142 034 B1    8/2007
(Continued)

OTHER PUBLICATIONS

International Search Report for PCT Application No. PCT/US2011/044412 mailed Feb. 17, 2012.
(Continued)

Primary Examiner — Moazzam Hossain
(74) Attorney, Agent, or Firm — RatnerPrestia

(57) ABSTRACT

A method of manufacturing a down-conversion substrate for use in a light system includes forming a first crystallography layer including one or more phosphor materials and, optionally, applying at least one activator to the crystallography layer, heating the crystallography layer at high temperature to promote crystal growth in the crystallography layer, and drawing out the crystallography layer and allowing the crystallography layer to cool to form the down-conversion substrate. A light system includes an excitation source for emitting short wavelength primary emissions; and a down-conversion substrate disposed in the path of at least some of the primary emissions from the excitation source to convert at least a portion of the primary emissions into longer-wavelength secondary emissions, wherein the substrate
(Continued)

includes one or more crystallography layers, wherein each crystallography layer includes one or more phosphor materials, and optionally at least one activator. Down-converted secondary light may be produced by the system.

13 Claims, 8 Drawing Sheets

(51) Int. Cl.
*H01L 33/00* (2010.01)
*C09K 11/77* (2006.01)
*H01L 33/50* (2010.01)
*B82Y 30/00* (2011.01)

(52) U.S. Cl.
CPC .............. *H01L 33/44* (2013.01); *B82Y 30/00* (2013.01); *H01L 33/502* (2013.01); *H01L 33/504* (2013.01); *H01L 2933/0041* (2013.01); *Y02B 20/181* (2013.01); *Y10S 977/774* (2013.01); *Y10S 977/949* (2013.01)

(58) Field of Classification Search
USPC ...... 438/35, 956; 257/98, E33.061, E27.118, 257/E27.122; 313/467, 501, 502, 503
See application file for complete search history.

(56) References Cited

U.S. PATENT DOCUMENTS

| | | |
|---|---|---|
| 2005/0006659 A1 | 1/2005 | Ng et al. |
| 2005/0193942 A1* | 9/2005 | Gorgoni et al. .................. 117/3 |
| 2005/0212397 A1 | 9/2005 | Murazaki et al. |
| 2005/0227117 A1* | 10/2005 | Locher et al. ................ 428/702 |
| 2007/0090748 A1 | 4/2007 | Sasaguri |
| 2007/0215890 A1* | 9/2007 | Harbers et al. ................. 257/98 |
| 2008/0042153 A1* | 2/2008 | Beeson et al. .................. 257/94 |
| 2008/0075941 A1* | 3/2008 | Tatartchenko et al. ........ 428/220 |
| 2008/0121919 A1* | 5/2008 | Krames et al. ................. 257/98 |
| 2008/0282968 A1* | 11/2008 | Amosov ......................... 117/73 |
| 2009/0026920 A1 | 1/2009 | Shimomura et al. |
| 2009/0072700 A1* | 3/2009 | Kameshima et al. ........ 313/483 |
| 2009/0072710 A1 | 3/2009 | Schmidt et al. |
| 2010/0025656 A1* | 2/2010 | Raring et al. .................... 257/13 |
| 2010/0123386 A1 | 5/2010 | Chen |
| 2010/0295438 A1 | 11/2010 | Ott et al. |
| 2011/0220920 A1 | 9/2011 | Collins et al. |

FOREIGN PATENT DOCUMENTS

| | | |
|---|---|---|
| JP | 2001-203383 A | 7/2001 |
| JP | 2005033211 A | 2/2005 |
| JP | 2005-314216 A | 11/2005 |
| JP | 2005-330459 A | 12/2005 |
| JP | 2007200949 A | 8/2007 |
| JP | 2008294378 A | 12/2008 |
| JP | 2009231525 A | 10/2009 |
| JP | 2013-522875 A | 6/2013 |
| JP | 2013-534042 A | 8/2013 |
| WO | 2009039827 A1 | 4/2009 |
| WO | WO 2009/126272 A1 | 10/2009 |
| WO | WO 2011/147521 A1 | 12/2011 |

OTHER PUBLICATIONS

IPER for PCT Application No. PCT/US2011/044412 mailed Jan. 31, 2013.
Written Opinion for PCT Application No. PCT/US2011/044412 mailed Feb. 17, 2012.
Takizawa et al., "Single crystal growth of RE doped thiogallates and their optical properties," Journal of Physics and Chemistry of Solids 69 (2008) 347-352.
European Supplemental Search Report issued in EP 11 81 0236.7 dated Mar. 19, 2015.
JPO Office Action issued in Japanese Application No. 2013-520788 dated Sep. 15, 2015.
Notice of Reasons for Rejection for Japanese Application No. 2016-045680, dated Apr. 25, 2017, including English translation, 11 pages.

* cited by examiner

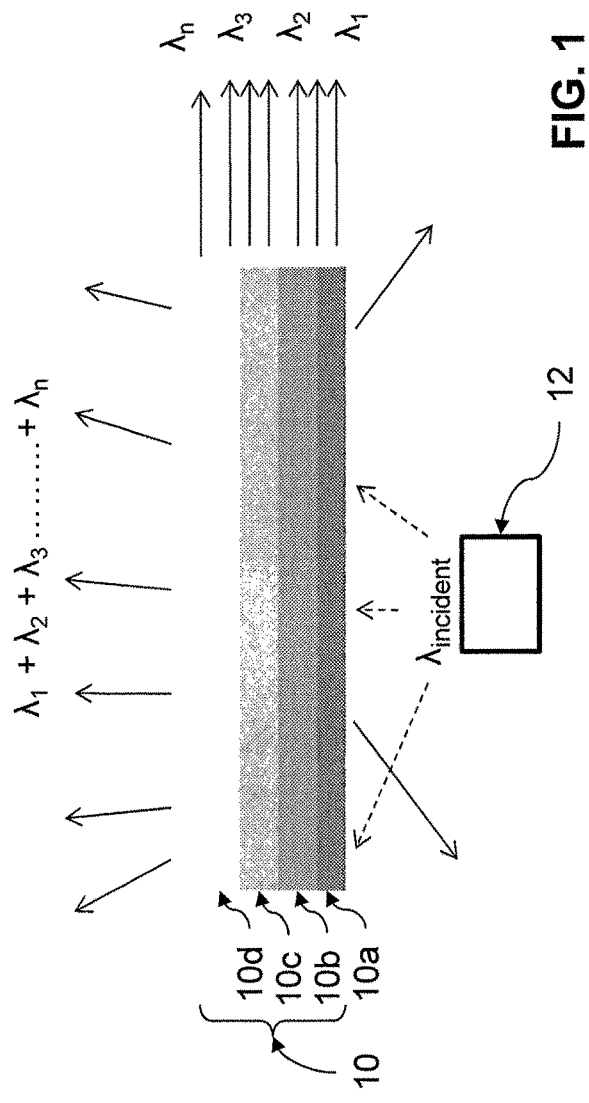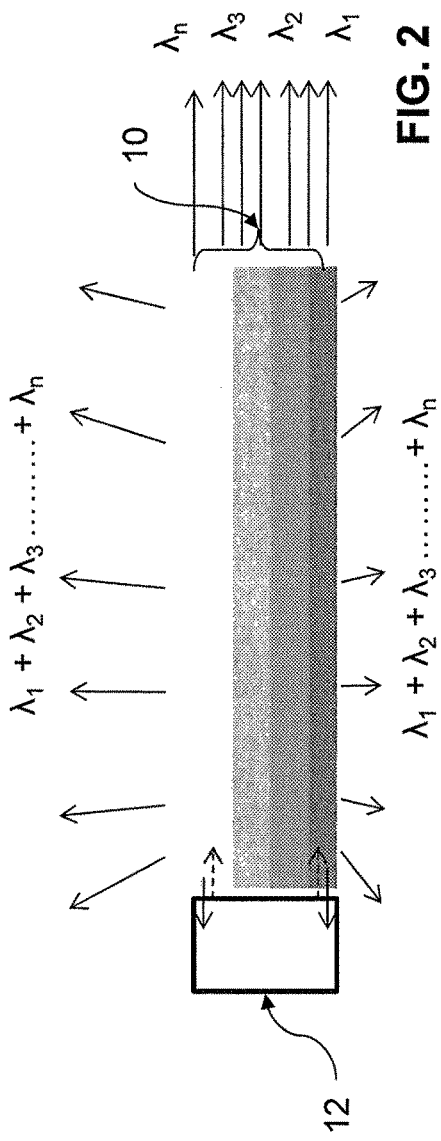

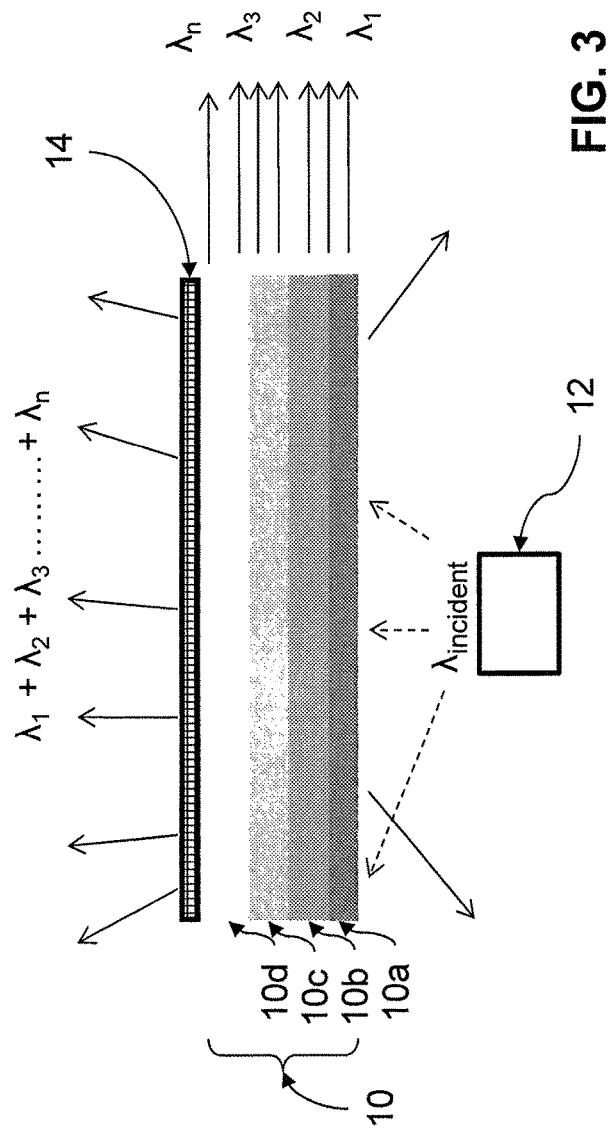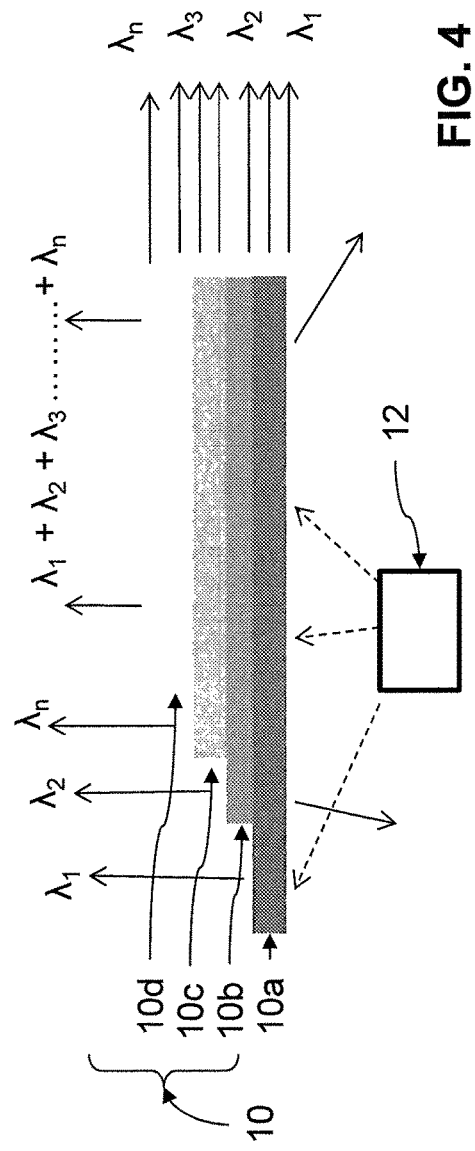

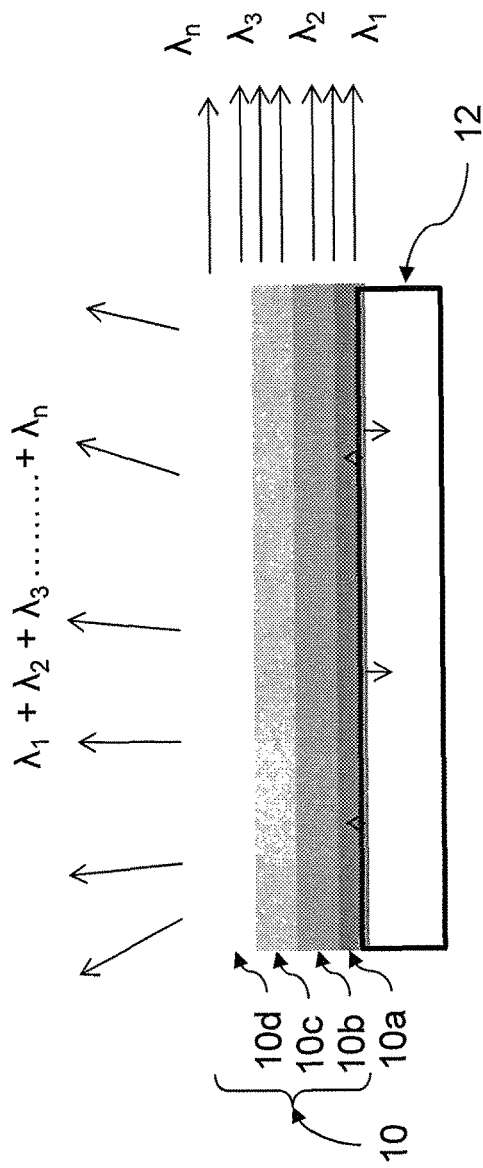
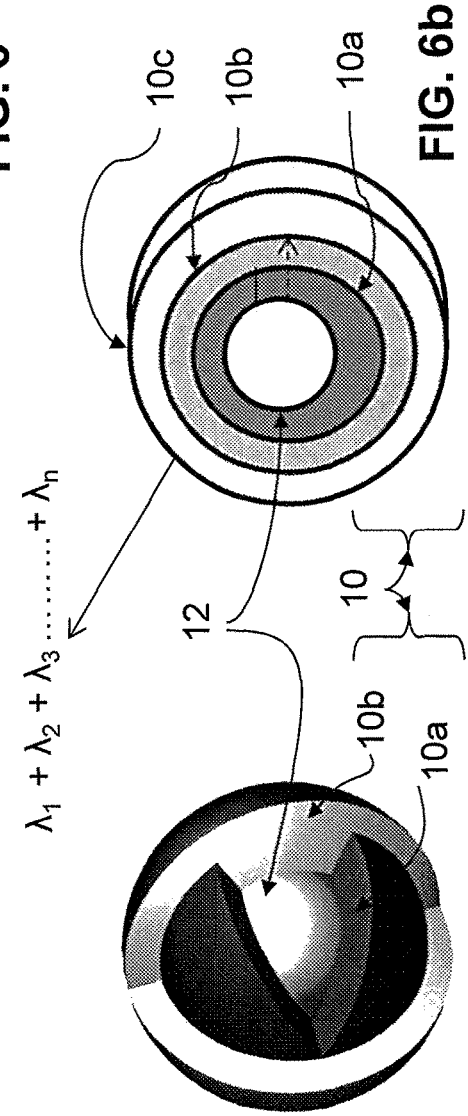

Example of composition variation:

$Ba_xSr_yCa_zGa_rS_q : (Eu^{2+})_t$

From bottom to top of structure (mole fraction variations):

x ranges from 1 about to about 0
y ranges from 0 about to about 1
z ranges from about 0 to about 1
r ranges from about 2 to about 0
q ranges from about 4 to about 1
t remains constant at about 0.02

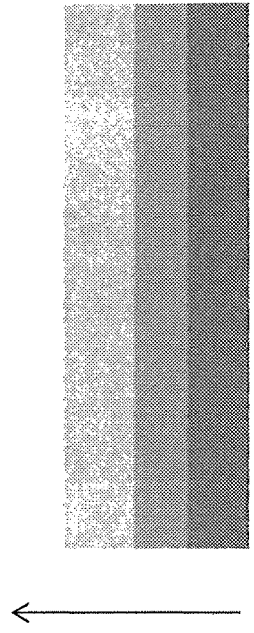

FIG. 8a

Example of dopant variation:

$Ba_xSr_yCa_zGa_rS_q : (Ce^{3+})_t (Eu^{2+})_w (Mn^{2+})_v$

From bottom to top of structure (mole fraction variations):

x, y, z remains constant at about 0.33
r remains constant at about 2
q remains constant at about 4
t ranges from about 0.03 to about 0
w ranges from about 0 to about 0.02
v ranges from about 0 to about 0.01

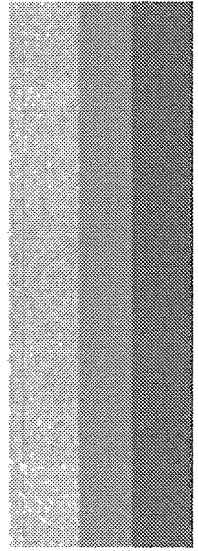

FIG. 8b

FULL SPECTRUM SOLID STATE WHITE LIGHT SOURCE, METHOD FOR MANUFACTURING AND APPLICATIONS

CROSS-REFERENCE TO RELATED APPLICATIONS

This application is the U.S. National Phase Application of PCT/US2011/044412, filed Jul. 19, 2011 and claims the benefit of priority to U.S. Provisional Application Ser. No. 61/399,890, filed Jul. 19, 2010, the disclosure of which is incorporated in its entirety by reference herein for all purposes.

FIELD OF THE INVENTION

The present invention relates generally to down-conversion lighting systems. Specifically, the present invention relates to methods of manufacturing down-conversion substrates, down-conversion light systems incorporating the substrates, and methods of producing down-converted secondary light emissions.

BACKGROUND OF THE INVENTION

Solid-state light (SSL) emitting devices, including solid-state light fixtures having light emitting diodes (LEDs) are extremely useful, because they potentially offer long term durability benefits over conventional light fixtures, such as those that utilize incandescent and fluorescent lamps. Due to their long operation (burn) time and low power consumption, solid-state light emitting devices frequently provide a functional cost benefit, even when their initial cost is greater than that of conventional lamps. Rapidly advancing large scale semiconductor manufacturing techniques will enable solid-state light fixtures to be produced at extremely low cost.

In addition to applications such as indicator lights on home and consumer appliances, audio visual equipment, telecommunication devices and automotive instrument markings, LEDs have found considerable application in indoor and outdoor informational displays. For example, LEDs may be incorporated into overhead or wall-mounted lighting fixtures, and may be designed for aesthetic appeal.

With the development of efficient LEDs that emit blue or ultraviolet (UV) light, it has become feasible to produce LEDs that generate white light through wavelength conversion of a portion of the primary emission of the LED to longer wavelengths. This transformation is often described as the "Stokes shift." Conversion of primary emissions of the LED to longer wavelengths is commonly referred to as down-conversion of the primary emission. Due to metamerism, it is possible to have quite different spectra that, when mixed, appear white. This system for producing white light by combining an unconverted portion of the primary emission with the light of longer wavelength is well known in the art. Other options to create white light with LEDs include mixing two or more colored LEDs in different proportions. For example, it is well known in the art that mixing red, green and blue (RGB) LEDs produces white light. Similarly, mixing RBG and amber (RGBA) LEDs, or RGB and white (RGBW) LEDs, are known to produce white light.

Various methods for manufacturing phosphor LEDs capable of down-converting primary emission have been tested and applied in the art. These methods generally focus on the synthesis of phosphor powders. The blending of phosphor powders is often a cost-effective method to produce a phosphor LED. These traditional methods, however, are generally ineffective for the production of LEDS capable of emitting a multitude of individual wavelengths because it is difficult to control the conversion properties of the blended phosphors. Specific materials and, optionally, dopants may be selected to produce a phosphor having particular light conversion properties, but the resulting powder-based phosphor may generally only be employed to produce a uniform converted light and not a multitude of individual emission wavelengths. Additionally, powder-based phosphors generally require binder materials, such as an organic resin or epoxy, which often have a different refractive index from the phosphor particles. This prevents the phosphor from being optically transparent or translucent and reduces the light extraction efficiency and, hence, the energy efficiency of the phosphor LEDs.

More recently, a number of epitaxial technologies have been developed to produce substrates capable of emitting a multitude of individual wavelengths. Direct emission LEDs based on epitaxial technology requires years of intense development, however, and are generally cost prohibitive. Each emission wavelength produced by the epitaxy substrate requires fine tuning of the device structures, fabrication schemes, optimization of layer compositions, and dopant levels, among other factors, to achieve the particularly desired light conversion properties. The equipment necessary for such manufacturing methods is also costly and difficult to utilize in a stream-lined manner for high volume production.

Similarly, recent technology has sought to manufacture and employ luminescent ceramic phosphors. A luminescent ceramic phosphor may be formed by heating a powder phosphor at high temperature until the surfaces of the phosphor particles begin to soften and a liquid surface layer forms. Interparticle interaction and shrinkage of the particles during sintering produces a rigid agglomerate of particles. Further processing of the sintered predensified ceramic is generally necessary to form a polycrystalline ceramic layer with low residual internal porosity. Unlike a thin film, which optically behaves as a single, large phosphor particle with no optical discontinuities, a luminescent ceramic behaves as tightly packed individual phosphor particles, such that there are small optical discontinuities at the interface between different phosphor particles. Thus, unlike powder-based phosphors, luminescent ceramics are optically almost homogenous and have the same refractive index as the phosphor material forming the luminescent ceramic. This method may be used to produce substrates capable of emitting a multitude of individual wavelengths. Luminescent ceramic phosphors, like powder-based phosphors, are generally incapable of being employed to produce polarized light emission or light propagation.

SUMMARY OF INVENTION

The inventor of the present invention has now discovered a novel method for manufacturing down-converting substrates which are capable of emitting a multitude of individual wavelengths and producing a full spectrum broad wavelength white light source. The down-converting substrates produced by the novel methods are also capable of being optically transparent or translucent. The methods and substrates of the present invention, when incorporated into light systems, enable the high efficiency, high flux, narrow or wide spectral width, large area, low cost LEDs with peak emission wavelength in the range of visible wavelength range from 400-750 nm. Additionally, the substrates and light systems are capable of producing polarized light emission or light propagation, unlike powder-based phosphor LEDs or luminescent ceramic phosphor LEDs. The methods of the present invention also enable the design and fabrication of high color rendering index sources, high color gamut sources, and high efficacy light sources.

To meet this and other needs, and in view of its purpose, the present invention provides a method of manufacturing a down-conversion substrate for use in a light system, the method comprising: forming a first crystallography layer comprising one or more phosphor materials and, optionally, applying at least one activator to the crystallography layer; heating the crystallography layer at high temperature to promote crystal growth in the crystallography layer; and drawing out the crystallography layer and allowing the crystallography layer to cool to form the down-conversion substrate. Unlike powder-based phosphors, the phosphor substrate of the present invention is grown as a crystal from melt as a single crystallographic phase poly-crystalline and single crystalline ingots or thick films. By using suitable crystallographic phases and purity, the present invention also enables the production of down-converting substrates capable of spectral width narrowing, highest possible quantum efficiency, and optically transparency.

In some embodiments, one or more additional crystallography layers comprising one or more phosphor materials may be deposited upon the first crystallography layer. The phosphor materials of the first layer and the one or more additional layers may be selected to create a crystallography layer from the group consisting of yttrium aluminum garnet, silicate garnet, vanadate garnet, mixed oxides, alkaline earth metal silicates, alkaline earth metal sulfides and selenides, alkaline earth metal thiogallates, metal nitrides, metal oxonitrides, and mixed molybdate-tungstate families, and mixed glass phosphors, and mixtures thereof. The crystallography layers may be formed by gradually adding the phosphor materials into a molten compound, depositing phosphor materials by vapor phase layer deposition, depositing using organic precursors, or depositing phosphor materials by atomic layer deposition. The substrate may be a graded substrate or a uniform substrate. Each layer may optionally use an activator, such as a dopant, and each layer may use the same or a different activator. Particular dopant activators include samarium (Sm), dysprosium (Dy), europium (Eu), cerium (Ce), praseodymium (Pr), terbium (Tb), holmium (Ho), neodymium (Nd), erbium (Er), and the like. and mixtures thereof.

In another embodiment, the present invention provides a light system comprising: an excitation source for emitting short wavelength primary emissions; and a down-conversion substrate disposed in the path of at least some of the primary emissions from the excitation source to convert at least a portion of the primary emissions into longer-wavelength secondary emissions, wherein the substrate comprises one or more crystallography layers, wherein each crystallography layer comprises one or more phosphor materials, and optionally at least one activator. The excitation source may be disposed adjacent to, remote from, or embedded within the substrate. The light system may further include other known features used to modify the characteristics of the emitted light. For example, when the excitation source is disposed on a first planar side of the substrate, the light system may also include at least one diffraction grating disposed on a second planar side of the substrate opposite the excitation source. When the excitation source is disposed at a first end of a longitudinal axis of the substrate, the light system may include an integration lens and/or mirror disposed at a second end of the longitudinal axis of the substrate opposite the excitation source. The longer-wavelength emissions from each crystallography layer may be combined to produce a colored light or a full spectrum white light. Each crystallography layer may be configured to emit light at a desired longer-wavelength emission when excited along the crystallography layer.

In still another embodiment, the present invention provides a light system comprising: an excitation source; a first down conversion substrate encapsulating the excitation source; and a second down conversion substrate encapsulating the first down conversion substrate. In general, the phosphor substrate or individual layers of the phosphor substrate can be spatially located inside an integrating sphere along with the primary excitation source (either present inside or outside the sphere) for creating the white light spectrum. This arrangement for color mixing will generally not preserve the polarization characteristics of the excitation source. In a further embodiment, the arrangement would be to use an array of mirrors or reflectors for multiple reflections to create white light. In this arrangement, individual phosphor layers could be present with each having a backside reflector disposed thereon. This arrangement can preserve the polarization state of the excitation light source if the incidence angle is equal to the Brewster angle. Additionally the use of a movable excitation source and/or one or more movable substrate layers enables the light systems according to this embodiment to function as a tunable light synthesizer.

In yet another embodiment, the present invention provides a method of producing down-converted secondary light emissions for use with an excitation source, the method comprising: producing a primary light emission from the excitation source; and passing the primary light emission through a down-conversion substrate disposed in the path of at least some of the primary emissions from the excitation source to convert at least a portion of the primary emissions into down-converted secondary light emissions, wherein the substrate comprises one or more crystallography layers, wherein each crystallography layer comprises one or more phosphor materials, and optionally at least one activator.

The down-conversion material, in the embodiments of the present invention, may be disposed remotely, i.e., away from the light source(s), adjacent to the light source, embedded within the light source, or a number of other configurations. One or more down-converting materials are used to absorb radiation in one spectral region and emit radiation in another spectral region. Multiple down-converting materials are capable of converting the wavelength emitted from the light source to the same or different spectral regions. The down-conversion materials may be mixed together or employed as individual layers. By capturing both the forward transferred portion and the back transferred portion of the down-converted light, system efficiency may be improved. Additional components may be employed to enhance the directional light output, aesthetics, or light quality of the light systems of the present invention including, for example, reflectors, diffraction gratings, and light guides. Similarly, the position of these components may be adjusted to ensure the desired light output and visual effect. Heat sinks may be utilized to reduce and/or redistribute heat at the light source(s). All of these structural parameters and features are contemplated by the embodiments of the present invention.

The embodiments of the present invention which incorporate the down-conversion material into an LED package will have substantial use and impact in industry. For example, the availability of LEDs with a multitude of emission wavelengths will accelerate the development and deployment of smart lighting systems. In addition, many applications where gas or solid state lasers are used today could be replaced by LEDs if the necessary wavelength, powder density and spectral widths are matched to existing laser emission lines. The embodiments of the present invention enable substantial manufacturing and operational benefits, such as costs savings, safety improvements, and systems which are capable of meeting a myriad of lighting demands.

BRIEF DESCRIPTION OF THE DRAWINGS

The invention is best understood from the following detailed description when read in connection with the accompanying drawings, in which:

FIG. 1 is an illustration of a method of producing down-converted light, according to at least one embodiment of the present invention, in which an excitation source is disposed to pass a primary emission through a down-converting substrate;

FIG. 2 is an illustration of a method of producing down-converted light, according to another embodiment of the present invention, in which an excitation source is disposed to pass a primary emission along a down-converting substrate;

FIG. 3 is an illustration of the embodiment shown in FIG. 1, which further includes a diffraction grating;

FIG. 4 is an illustration of a method of producing down-converted light, according to another embodiment of the present invention, in which an excitation source is disposed to pass a primary emission through a down-converting substrate having more than one down-conversion layers of varying dimensions;

FIG. 5 is an illustration of a method of producing down-converted light, according to another embodiment of the present invention, in which an excitation source is disposed adjacent a down-converting substrate;

FIG. 6a is an illustration of a method of producing down-converted light, according to another embodiment of the present invention, in which an excitation source is embedded within a down-converting substrate which is in the form of a three-dimensional sphere;

FIG. 6b is an illustration of a method of producing down-converted light, according to another embodiment of the present invention, in which an excitation source is embedded within a disc-type or cell-type down-converting substrate;

FIG. 8a is an illustration of at least one embodiment in which the phosphor material composition is configured to provide a gradient, while the dopant is kept constant;

FIG. 8b is an illustration of at least one embodiment in which the phosphor material composition is kept uniform, while the dopant is configured to provide a gradient;

DETAILED DESCRIPTION OF THE INVENTION

Figure 7A:
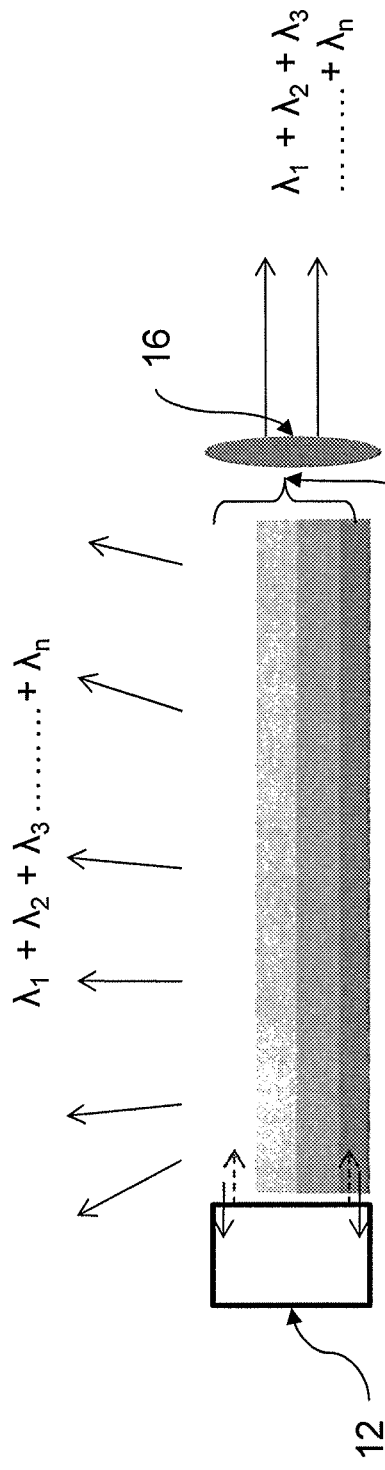
FIG. 7a is an illustration of the embodiment shown in FIG. 2, which further includes an integration lens.

Although the invention is illustrated and described herein with reference to specific embodiments, the invention is not intended to be limited to the details shown. Rather, various modifications may be made in the details within the scope and range of equivalents of the claims and without departing from the invention.

The use of down-converting materials aids in the production of light that is aesthetically similar to that which is produced by traditional light fixtures, such as those which utilize incandescent A-lamps. As described above, the down-converting material of the present invention may be composed of one or more materials adapted to absorb radiation in one spectral region and emit radiation in another spectral region. It will be appreciated that the terms "down conversion," "down converting," and "down-converted" refer to materials which are adapted to absorb radiation in one spectral region and emit radiation in another spectral region. Accordingly, the term "down conversion material" is defined as materials that can, through their composition, absorb radiation in one spectral region and emit it in another spectral region.

As light emitted from the light source reaches the down-converting material, the down-converting material absorbs the photons with wavelengths present in the light source and emits photons at different wavelengths to form converted light. For example, the down-converting material absorbs short wavelength light and emits down converted light of a higher wavelength. As known in the art, "short wavelength" or "primary light" is intended to describe a high frequency light emission, such as that of an ultraviolet or blue visible light emission ranging, for example, wavelength from about 200 nm to about 480 nm (about $10^{16}$ Hz to about $10^{15}$ Hz). Similarly, "higher wavelength," "high wavelength," "down-converted," "converted," or "secondary light" is intended to describe a lower frequency light emission, such as that of a visible light emission ranging, for example, from about 450 nm to about 750 nm (about $10^{15}$ Hz). The emitted down converted light may travel in all directions (known as a Lambertian emitter), and therefore, a portion of the down converted light travels upwards while another portion travels downwards. The light that goes upwards (or outwards) from the down conversion material is the forward transmitted portion of the light and the light that comes downwards towards the light source is the back transmitted portion. This is explained further below with regard to the figures.

The present invention is directed to LED light systems utilizing single or polycrystalline phosphor as the down-conversion material, and methods for fabricating the down-conversion material. Simultaneous tuning of various properties such as emission wavelength, spectral width, and polarization over a large area is possible by single phase crystallography of the down-converting materials grown as a continuous substrate (i.e., without microscopic discontinuity). The crystalline phosphor substrates are manufactured for example, from melts, as single crystallographic phase polycrystalline substrates, single crystalline ingots, or as films. The embodiments of the present invention effectively correlate the crystallographic phases of the substrate layers, i.e., within the uniform or graded composition of the substrate, with the desired emission properties of resulting crystalline phosphor substrate. The resulting down-converting substrates are capable of emitting a multitude of individual wavelengths and producing a full spectrum broad wavelength white light source, without requiring additional process equipment or manufacturing steps.

The use of single crystalline phosphors allows for effective phosphor integration and minimizes scattering related emission losses, thereby improving LED package efficiency. As discussed in further detail below, one or more excitation sources such as blue or ultraviolet emission LEDs may be embedded or encased by the down-converting substrates. The use of crystal growth technology for the fabrication of the light systems of the present invention are compatible with existing manufacturing practices and techniques for the manufacturing of excitation sources. For example, the single crystalline phosphors can be employed to act as the carrier substrate for AlGaInN LEDs during the post-growth epitaxial film lift-off process from a sapphire substrate or even act as the substrate onto which the AlGaInN LED device structure is epitaxially grown. The single crystalline substrates or plates can also be formed substantially defect free and can bond to epitaxial materials or substrates, if such further processing is performed to achieve the desired aesthetic and functional parameters. Accordingly, the methods of the present invention enable further operational advantages, such as by reducing manufacturing steps currently necessary to produce down-converting substrates which are capable of emitting a multitude of individual wavelengths.

The single crystalline phosphor may be formed using a number of techniques which result in a single crystalline phosphor providing one or more phosphors in periodic lattice or structure. Single crystals are crystalline solids in which the crystal lattice is continuous and unbroken to the edges of the crystal with no grain boundaries. Fabrication of single crystals typically involves the building of a crystal, layer-by-layer of atoms. Techniques to produce large single crystals include slowly drawing a rotating "seed crystal" in a molten bath of feeder material, commonly referred to as a "melt." Processes utilizing these techniques are known in the art as the Czochralski process or the Bridgman-Stockbarger technique. Other known processes include gradient freezing, float zone, flux or solution growth, and liquid phase epitaxial techniques. These processes may be used to grow and produce a crystalline phosphor down-converting material in a number of forms including, for example, a substrate, block, boule, thin film, or compressed/stack plate, among others known in the art.

In one embodiment of the present invention, the method of manufacturing a down-conversion substrate includes forming a first crystallography layer comprising one or more phosphor materials and, optionally, applying at least one activator to the crystallography layer. The first crystallography layer is then heated at high temperature to promote crystal growth in the crystallography layer. The high temperature is typically in the range of about 800° C. to about 1000° C. As the crystals grow, they may be extracted, such as by slowly drawing out the crystalline structure, and allowed to cool to form the down-conversion substrate. In some embodiments, one or more additional crystallography layers comprising one or more phosphor materials may be deposited upon the first crystallography layer while, optionally, applying at least one activator to each of the one or more additional crystallography layers. The activators may be dopants, such as samarium (Sm), dysprosium (Dy), europium (Eu), cerium (Ce), praseodymium (Pr), terbium (Tb), holmium (Ho), neodymium (Nd), erbium (Er), and the like, and mixtures thereof.

The crystalline phosphor down-converting substrate may be a graded phosphor material, in which the density, crystal size, and other crystalline parameters may be modified at different regions of the substrate while still maintaining a single phosphor composition. This can be achieved by a number of known techniques, such as by controlling and adjusting the temperature, duration, and formation materials at different periods of the manufacturing method. Additionally or alternatively, the phosphor material may be kept constant throughout to form a uniform substrate, while a number of different dopants are used to form different regions within the substrate. Accordingly, the terms "graded" and "uniform" are meant to indicate whether certain crystalline parameters within the substrate are different or the same throughout the crystalline phosphor down-converting substrate.

As yet another method, a number of different phosphor materials may be used to form either a graded or uniform substrate, with one or more dopants used for each phosphor material. As would be appreciated by one having ordinary skill in the art, the number and type of phosphor materials and dopants employed may be adjusted to achieve the particular substrate parameters and desired light output characteristics. For example, the first crystallography layer and the one or more additional crystallography layers may each comprise the same phosphor material, with either the same or different crystalline parameters, to form effectively a uniform or graded overall substrate composition. These layers may each also be doped with the same or different dopants. The resulting crystalline phosphor down-converting substrate may, accordingly, have any number of formulations and compositions. These embodiments are detailed further below with regard to the accompanying figures.

The single crystalline phosphor substrate can comprise many different phosphor materials that can be engineered to absorb different wavelengths of light emitted from an excitation source and re-emit different wavelengths of light. In a preferred embodiment the single crystalline phosphor substrate can absorb blue light having a wavelength in the range of 450 to 480 nm and re-emit a yellow light to produce, when the remaining unconverted light emission from the blue LED and down-converted yellow light emission are combined, a desired white light emission. As would be appreciated by one having ordinary skill in the art, however, the phosphor materials and activators may be selected to produce a crystalline phosphor substrate capable of producing a myriad of light color, quality, and other desirable emission characteristics.

A number of different phosphor materials may be used to produce the crystalline phosphor substrate, which may be selected from a number of well-known phosphor families. For example, the phosphors of the yttrium aluminum garnet, silicate garnet, vanadate garnet, mixed oxides, alkaline earth metal silicates, alkaline earth metal sulfides and selenides, alkaline earth metal thiogallates, metal nitrides, metal oxonitrides and mixed molybdate-tungstate families, as well as mixed glass phosphors, may be employed to produce the crystalline phosphor substrate. A more detailed listing of exemplary phosphors includes, but is not limited to:
1. Yttrium aluminum garnet family: $(Y_xGd_{1-x})_3(Al_yGa_{1-y})_5O_{12}$: $Ce^{3+}$, $Pr^{3+}$, $Eu^{2+}$;
2. Silicate garnet family: $M_xM_yL_{2a}L_{2b}Q_cQ_dR_{4e}R_4fO_{12}$: $Ce^{3+}$, $Eu^{3+}$; where M represents elements from Group IIA (Mg, Ca, Sr, Ba), L represents rare earth elements from the group consisting of Sc, Y, La, Ce, Pr, Nd, Pm, Sm, Eu, Gd, Tb, Dy, Ho, Er, Tm, Yb and Lu; Q are elements from Group IVA (Si, Ge, Sn, Pb); and R are elements from Group IIIA (B, Al, Ga, In, Tl);

3. Vanadate garnet family: $M_{2x}M_{2y}Q_aQ_bM_{2c}M_{2d}V_3O_{12}$: $Eu^{3+}$; where M represents elements from Group IIA (Mg, Ca, Sr, Ba), and Q represents elements from Group IA (Li, Na, K, Rb, Cs);

4. Mixed oxides family: $(Y_{2-x-y}Eu_xBi_y)O_3$: $Eu^{3+}$, $Tb^{3+}$; where Q represents elements from Group IA (Li, Na, K, Rb, Cs); $YCa_3M_{3x}M_{3y}B_4O_{15}$: $Eu^{3+}$; where M represents elements from Group IIIA (Al, Ga, In); $LaCeM_{2x}M_{2y}R_aR_bO_5$: $Ce^{3+}$ and $M_{2x}M_{2y}R_{2a}R_{2b}O_4$: $Eu^{2+}$; where M represents elements from Group IIA (Mg, Ca, Sr, Ba), and R represents elements from Group IIIA (B, Al, Ga, In);

5. Alkaline earth metal silicates family: $(Ba_{1-x-y}Sr_xCa_y)SiO_4$: $Eu^{2+}$; $Ca_3MgSi_2O_8$: $Eu^{2+}$, $Sr_3MgSi_2O_8$: $Eu^{2+}$, $Ba_3MgSi_2O_8$: $Eu^{2+}$, $Ba_2MgZnSi_2O_4$:$Eu^{2+}$, $Sr_3SiO_5$:$Eu^{2+}$, $Li_2SrSiO_4$:$Eu^{2+}$, and $A_2SiO_4$: $Eu^{2+}$, D; where A is an element from Group II (Sr, Ba, Ca, Zn, Cd, Mg) and D is an element such as F, Cl, Br, I, N, S, P;

6. Alkaline earth metal sulfides and selenides: MS: $Eu^{2+}$ and MSe: $Eu^{2+}$; where M is one or more elements from Group IIA (Mg, Ca, Sr, Ba), such as $Ca_{1-x}Sr_xS$: $Eu^{2+}$, $Ca_{1-x}Sr_xSe$: $Eu^{2+}$, $Ca_{1-x}Sr_xS_ySe_{1-y}$: $Eu^{2+}$;

7. Alkaline earth metal thiogallates: $M_xM_yA_{2a}A_{2b}S_4$: $Eu^{2+}$; $MA_2(S_xSe_y)_4$: B; $MA_4(S_xSe_y)_7$: B; $M_2A_4(S_xSe_y)_7$: B; and $(M1)_m(M2)_nA_p(S_xSe_y)_q$; where M, M1, and M2 are one or more elements selected from the group consisting of Be, Mg, Ca, Sr, Ba, and Zn; A are one or more elements from Al, Ga, In, Y, La, Gd; B is an element from Eu, Ce, Cu, Ag, Al, Tb, Cl, Br, F, I, Mg, Pr, K, Na, Mn; p is about 2 or about 4; and q is about 4 or about 7;

8. Metal nitrides family: $M_xSi_yN_z$: $Eu^{2+}$, $Ce^{3+}$; where M is one or more elements selected from Mg, Ca, Sr, Ba, Ln, Y, Yb, Al; such as $Sr_2Si_5N_8$: $Eu^{2+}$, $Ba_2Si_5N_8$: $Eu^{2+}$, $(Sr_{1-x-y}Ba_xCa_y)_2Si_5N_8$: $Eu^{2+}$, $CaAlSiN_3$: $Eu^{2+}$, $Ca_xAl_ySi_zN_3$: $Ce^{3+}$, and $CaSiN_2$:$Ce^{3+}$;

9. Metal oxo-nitrides family: $MSi_2O_2N_2$: $Eu^{2+}$; where M is one or more elements selected from Mg, Ca, Sr, Ba, Ln, Y, Yb, Al; $(SrCa)N_2Al_{p+q}Si_{12-p-q}O_qN_{16-q}$: $Eu^{2+}$ or $(Ca_xM_y)(Si,Al)_{12}(O,N)_{16}$: $Eu^{2+}$; where M is one or more elements selected from Eu, Tb, Yb, Er; $Li_xM_yLn_z$ $Si_{12-(m+n)}Al_{(m+n)}O_nN_{16-n}$: $Eu^{2+}$; where M is one or more elements selected from Ca, Mg, Y and Ln is one or more elements selected from Eu, Dy, Er, Tb, Yb, Ce; and $SrSiAl_2O_3N_2$: $Eu^{2+}$; $CaSi_2O_2N_2$: $Eu^{2+}$; CaSiAlON: $Eu^{2+}$; or LiSiAlON: $Eu^{2+}$;

10. Mixed Molybdate-Tungstate family: $A_pB_qMo_xW_{1-x}O_z$: R; where R is selected from the group $Ce^{3+}$, $Eu^{3+}$, $Pr^{3+}$, $Dy^{3+}$, $Tb^{3+}$ $Sm^{3+}$, $Ho^{3+}$, $Yb^{3+}$, $Mn^{4+}$, $Bi^{3+}$, $Sb^{3+}$, $Fe^{3+}$, $Sn^{2+}$, and the like; A and B are preferably elements from Groups IA, IB, IIA, IIB, IIIA, IIIB, IVA, IVB and VB; and z preferably is in the range of about 4 to about 6; and 11. Mixed glass phosphors: $SiO_2$—$B_2O_3$—$P_2O_5$—BaO—$Al_2O_3$—$Na_2O$—$Li_2O$—CaO—SrO, MgO—$TiO_2$: R; where R is selected from the group $Ce^{3+}$, $Eu^{3+}$, $Pr^{3+}$, $Dy^{3+}$, $Tb^{3+}$ $Sm^{3+}$, $Ho^{3+}$, $Yb^{3+}$, $Mn^{4+}$, $Bi^{3+}$, $Sb^{3+}$, $Fe^{3+}$, $Sn^{2+}$, and the like.

The subscripts in the compositional formulas above (e.g., x, y, z) are values from between 0 and 1 unless otherwise specified above. The rare earth and transition metal activator dopant species listed in the compositions after the designator ":" are merely non-limiting examples and other known dopants may be utilized by the embodiments of the present invention, as would be appreciated by one having ordinary skill in the art. The dopants/activators are typically in the range of 0.01 to 10 mole percentages depending on the phosphor composition. Excessive activators may lead to degradation of the phosphor wavelength conversion efficiency at high temperatures (as encountered during continuous LED operation) or at high optical flux. One particular embodiment utilizes a single phosphor material from the alkaline earth metal thiogallates family comprising strontium, calcium, gallium, indium, and sulfur, doped with europium to form the graded crystalline phosphor substrate represented by the formula $(SrCa)(GaIn)_2S_4$: $Eu^{2+}$.

The crystalline phosphor substrates exhibit reduced light scattering as a result of the ordered, continuously grown crystalline material structure. The phosphor substrates made by existing processes, such as powder-based and luminescent ceramic phosphors, the phosphor particles are in powder form with a certain particle size distribution typically ranging from 1-20 μm. Light emitted from an excitation source, such as an LED, can be scattered randomly or in many different directions as it impedes upon these particles. For single crystalline phosphors, however, the LED light encounters a perfect and ordered single-crystalline material, so scattering can be reduced or essentially eliminated. The reduction of scattering results in higher light extraction efficiency for the crystalline phosphor substrate. Similarly, the crystalline phosphor substrates have been found to reduce the amount of light loss due to internal reflection. As mentioned above, known processes for the manufacture of phosphor substrates include the use of various processing additives, such as binders, which typically have a refractive index that is different than that of the phosphor materials. This disparity is known to cause internal reflection, which results in a loss of usable light output from the phosphor substrate and light system. Crystalline phosphor substrates, however, do not require such binders or processing additives. Even if a binder was to be used, the internal reflection values of crystalline phosphor substrates are closer to the values of known binders. As a result, light systems which employ crystalline phosphor substrates will exhibit reduced internal reflection than those which employ traditional phosphor substrates.

Various embodiments of the present invention are described herein with reference to the figures. As would be readily appreciated by one having ordinary skill in the art, relative terms such as "upon" and "above" are used herein and intended to describe the arrangement of one layer or region with another in a myriad of ways. For example, when one component is described as being "on" another element, it can be directly on the other element, integrated into the other element, or have other intervening elements, such as processing additives. Similarly, terms such as "first" and "second" are intended to distinguish between one element, component, region, or layer discussed below, and such the labels used for such items may be interchanged without departing from the teachings of the present invention. It is understood that these terms are intended to encompass different orientations of the substrates and light systems in addition to the orientation depicted in the figures. Additionally, the dimensions and configurations of the components shown in the figures are for illustration purposes only, and these parameters may also be changed without departing from the teachings of the present invention.

FIG. 1 shows one exemplary embodiment of a light system manufactured by the methods according to the present invention. The light system includes a crystalline phosphor substrate 10. As discussed above, the crystalline phosphor substrate 10 may be a graded or uniform crystalline phosphor substrate. In a first embodiment, the crystalline phosphor substrate 10 may be a graded phosphor material, in which the density, crystal size, and other crystalline parameters may be modified at different regions of the substrate while still maintaining a single phosphor composition. This can be achieved by a number of known techniques, such as by controlling and adjusting the temperature, duration, and formation materials at different periods of the manufacturing method. In such an embodiment, regions 10a, 10b, 10c, and 10d would correspond to four gradations of the same phosphor material, with each region having different crystalline properties. In another embodiment, the phosphor material may be kept constant throughout to form a uniform substrate, while a number of different dopants are used to form different regions within the substrate. In this embodiment, regions 10a, 10b, 10c, and 10d would correspond to four dopant zones of the same phosphor material, with each zone utilizing a different dopant. In another embodiment, the regions may utilize both different gradations and dopants. As yet another method, a number of different phosphor materials may be used to form either a graded or uniform substrate, with one or more dopants used for each phosphor material. As would be appreciated by one having ordinary skill in the art, the number and type of phosphor materials and dopants employed may be adjusted to achieve the particular substrate parameters and desired light output characteristics. For example, the first crystallography layer and the one or more additional crystallography layers may each comprise the same phosphor material, with either the same or different crystalline parameters, to form effectively a uniform or graded overall substrate composition. These layers or regions may each also be doped with the same or different dopants. The resulting crystalline phosphor down-converting substrate may, accordingly, have any number of formulations and compositions. The individual layers or regions do not need to have the same parameters, such as length or thickness, and such parameters may be configured in a number of ways to achieve the desired light output characteristics.

A wide range of phosphors may be utilized, as described above. Additionally, quantum dots, nanoparticles, quantum wells, and nanotubes, may be utilized to provide the compositional change or "gradient" within the crystalline phosphor substrate. These materials are known to be effective down-converting materials and are known to offer potential advantages over conventional phosphor materials. For example, the emission spectra of quantum dots can be "tuned" by controlling the particle size distribution and/or surface chemistry, unlike phosphors where the emission spectra is largely fixed by the chemical composition and the dopant species. Additionally, the crystalline phosphor substrates may be composed of a number of materials to produce a particularly desired transmissive characteristic. For example, the crystalline phosphor substrates may be configured to be optically clear, i.e., entirely transmissive, translucent, reflective, diffusive, opaque, or any range of transmissiveness. The term "optically clear" is intended to mean entirely transparent, such as clear glass, which has a transmission greater than 90%.

A primary light emission is emitted from an excitation source 12. Typically a blue or ultraviolet excitation source is employed. Any excitation source known in the art may be utilized for this purpose including, for example, a light emitting diode (LED), laser diode, laser, or discharge lamp. The excitation source may be, for example, an ultraviolet light source (e.g., wavelength>100 nm) or a visible blue light source (e.g., wavelength about 400 to about 450 nm). The primary light emission is directed towards the crystalline phosphor substrate 10, which comprises one or more substrate regions 10a, 10b, 10c, and 10d, where the primary light emission is at least partially down-converted to a converted (i.e., longer wavelength) secondary emissions. The secondary emissions may include a multitude of individual wavelengths ($\lambda_1$, $\lambda_2$, $\lambda_3$, ... $\lambda_n$) emitted from the sides, ends, or edges of the crystalline phosphor substrates (e.g., along the longitudinal axis of the substrate or substrate layers), a full spectrum broad wavelength white light produced by the aggregate of individual wavelengths ($\lambda_1+\lambda_2+\lambda_3 ... +\lambda_n$) through the top, bottom, or perimeter surfaces of the crystalline phosphor substrates (e.g., through a planar surface of the substrate or substrate layers), or both. Depending on the compositional makeup of the crystalline phosphor substrates some back-transferred emissions may exist such as may be the case when the crystalline phosphor substrate is designed to be translucent, diffusive, or when processing additives are used at the interface between substrate regions. As known in the art, some of the primary light emission may pass-through the substrate without becoming down-converted. The amount of primary light emission that is down-converted may be controlled by a number of factors, including crystal size and substrate density.

As discussed above, the crystalline phosphor substrates of the present invention may be utilized to produce a full spectrum white light source or a multitude of individual wavelengths as a functional light guide. FIG. 2 shows an embodiment of the present invention, in which the light system utilizes the crystalline phosphor substrate to function primarily as a light guide. The excitation source 12 is configured to emit a primary emission through the edge of the crystalline phosphor substrate (e.g., along a longitudinal axis of the substrate or substrate layers), as opposed to the bottom of the crystalline phosphor substrate as shown in FIG. 1. The crystalline phosphor substrate thus functions as a light guide to produce down-converted secondary emissions of one or more individual wavelengths ($\lambda_1$, $\lambda_2$, $\lambda_3$, ... $\lambda_n$). Depending on the specifics of the configuration and the desired light output, some down-converted secondary emissions may additionally exit the crystalline phosphor substrate through the top, bottom, or perimeter surfaces of the crystalline phosphor substrate (e.g., a planar surface of the substrate or substrate layers) as an aggregate white light ($\lambda_1+\lambda_2+\lambda_3 ... +\lambda_n$). The embodiment shown in FIG. 2 may be particularly useful with lasers as a light source for color displays and lighting applications. For example, a white laser may be achieved with this embodiment by aggregating the discrete wavelengths produced by the regions of the crystalline phosphor substrate acting as individual light guides. Alternatively, particular individual colors may be desired and achieved through this embodiment.

Additional components may be utilized, in conjunction with the embodiments of the present invention, to produce a particular light output, color rendering, or any other desirable characteristic. For example, FIG. 3 shows an embodiment of the present invention in which the light system additionally employs a diffraction grating 14. As known in the art, a diffraction grating is an optical component with a periodic structure, which splits and diffracts light into several beams traveling in different directions. The directions of these beams depend on the spacing of the grating and the wavelength of the light so that the grating acts as the dispersive element. For practical applications, gratings generally have ridges or rulings on their surface rather than dark lines. Such gratings can be either transmissive or reflective. Diffraction gratings and other similar components known in the art may be utilized to achieve the desirable characteristics of the light produced by the light systems of the present invention.

FIG. 4 shows yet another embodiment of the present invention, in which the light system includes a crystalline phosphor substrate having regions or layers of varying dimensions. This configuration enables the production of both secondary emissions having individual wavelengths ($\lambda_1$, $\lambda_2$, $\lambda_3$, ... $\lambda_n$) and aggregate white light ($\lambda_1+\lambda_2+\lambda_3...+\lambda_n$) from the top of the crystalline phosphor substrate (e.g., a planar surface of the substrate or substrate layers). In this configuration, primary emissions from excitation source 12 may pass through one or more individual layers or regions 10a, 10b, 10c, and/or 10d of the crystalline phosphor substrate 10 to produce secondary emissions in a range of colors. For example, some primary emissions may pass-through and be down-converted by substrate region 10a. Other primary emissions from the excitation source 12 may pass-through and be down-converted by substrate regions 10a and 10b. Yet others may pass-through 10a, 10b, and 10c, while some primary emissions may pass-through all four regions of the crystalline phosphor substrate 10 shown in FIG. 4. The outputs of each of these pathways may produce secondary emissions of different parameters, depending on the compositions of the individual regions or layers and the dopants used. As with the embodiments illustrated in the previous figures, secondary emissions having individual wavelengths ($\lambda_1$, $\lambda_2$, $\lambda_3$, ... $\lambda_n$) may also be produced from the edge of the crystalline phosphor substrate (e.g., along a longitudinal axis of the substrate or substrate layers), if desired.

Figure 7B:
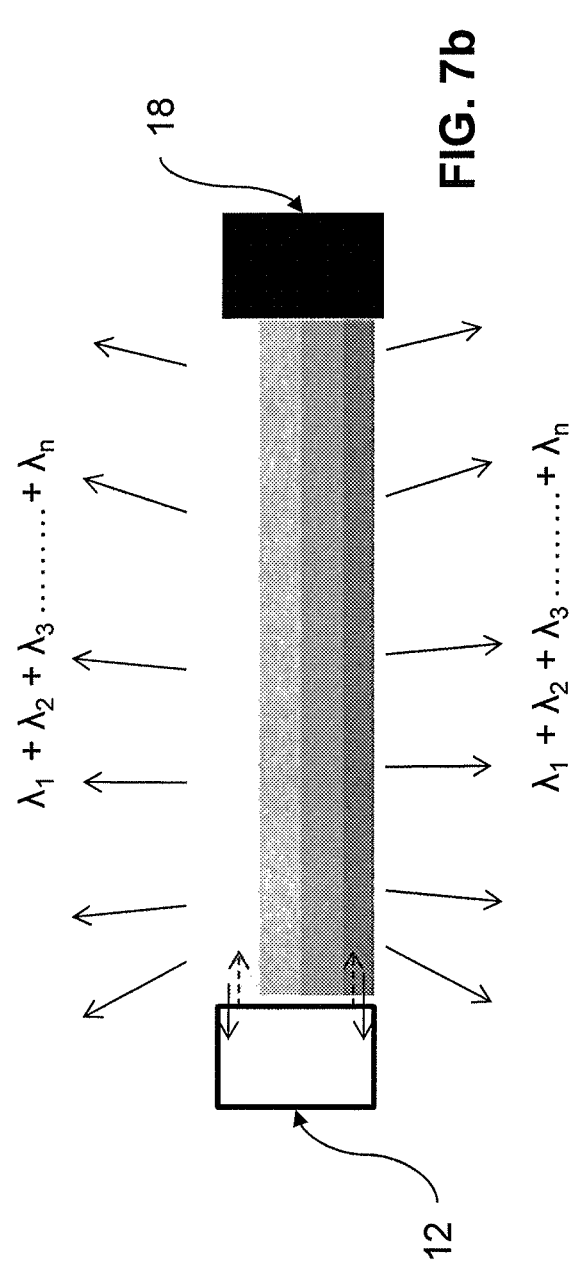
FIG. 7b is an illustration of the embodiment shown in FIG. 2, which further includes a mirror.

The components of the light system may also be configured in a myriad of ways. For example, the excitation source may be disposed remotely (i.e., distant) from the down-conversion crystalline phosphor substrate. Alternatively as shown in FIG. 5, some embodiments of the light system may dispose the excitation source adjacent to the crystalline phosphor substrate. In yet other embodiments, the excitation source may be configured such that it is entirely embedded within the down-conversion crystalline phosphor substrate. FIG. 6a shows such an embodiment, in which the excitation source 12 is entirely embedded within a spherical down-conversion crystalline phosphor substrate 10. FIG. 6a shows a cut-away of the three-dimensional spherical light system. The excitation source may also be configured such that it is embedded within a disk-style or cell-type down-conversion crystalline phosphor substrate in which the excitation source is not entirely encased by the substrate, as shown in FIG. 6b. Other components may be utilized by the light systems of the present invention to achieve the particularly desired light output characteristics. FIG. 7a, for example, shows a light guide style configuration of the light system of the present invention, which further utilizes an integration lens 16 to combine the individual wavelengths ($\lambda_1$, $\lambda^2$, $\lambda_3$, ... $\lambda_n$) produced as secondary emissions from the edge of the crystalline phosphor substrate (e.g., along a longitudinal axis of the substrate or substrate layers) into an aggregate white light ($\lambda_1+\lambda_2+\lambda_3...+\lambda_n$). The integration lens may be made of a number of known materials such as, for example, glass or plastics. Such a configuration may be particularly useful in laser-based light systems for use in, for example, color displays and lighting applications. FIG. 7b shows a light guide style configuration of the light system of the present invention, which further utilizes a mirror or reflector 18 to reflect at least some secondary emissions from the edge of the crystalline phosphor substrate back through the substrate. Any known mirror or reflective surface may used for this purpose such as, for example, a glass mirror or reflective metallic surface. Such a configuration may be utilized to control the amount of secondary emissions which exit the crystalline phosphor substrate as individual wavelengths and as aggregate white light, depending on the reflectivity of the mirror. A more reflective surface may be used for the mirror to promote more of the secondary emissions to exit as aggregate white light, while a less reflective surface may be used to allow more of the secondary emissions to exit as individual wavelengths.

Figure 11A:
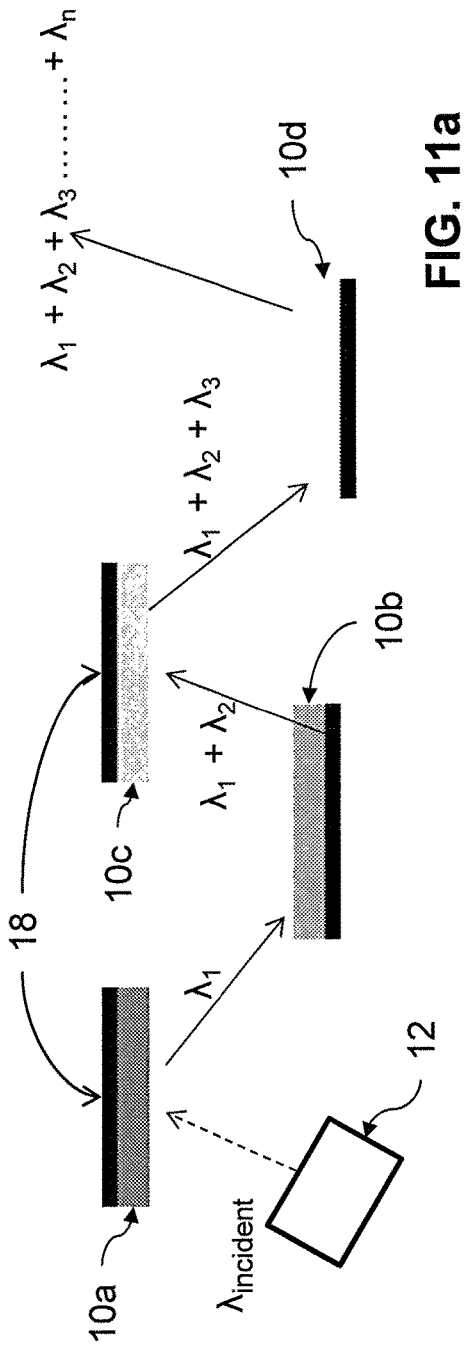
FIG. 11a shows an illustration of a further embodiment in which the light system is a tunable light synthesizer used to produce a full spectrum white light.
Figure 11B:
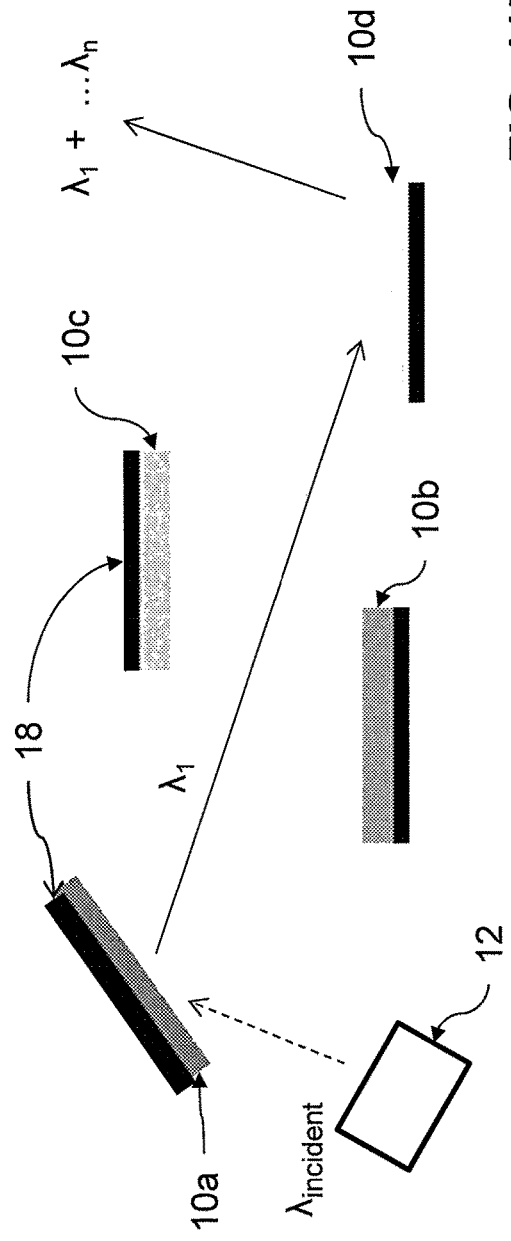
FIG. 11b shows an illustration of the embodiment shown in FIG. 11a which has been modified, by rotating a first substrate layer plate, to synthesize a light of a different desirable spectrum.

FIGS. 11a and 11b show further light system configurations according to embodiments of the present invention. FIGS. 11a and 11b both show a tunable light synthesizer system designed using individual crystalline phosphor substrate layers. Each crystalline phosphor substrate layer is stacked with a reflector, such as a mirror or a metallic surface, on the back side of the substrate layer. FIG. 11a shows a full spectrum source with all the individual wavelength components present. In this configuration, primary emissions from excitation source 12 may pass through the first individual crystalline phosphor substrate layer 10a to produce a secondary emission $\lambda_1$. The reflector 18 disposed adjacent to the first layer 10a then reflects the secondary emission in the direction of a second individual crystalline phosphor substrate 10b, where a secondary emission including both $\lambda_1+\lambda_2$ is emitted. The reflector 18 disposed adjacent to the second layer 10b then reflects this combined secondary emission in the direction of a third individual crystalline phosphor layer 10c, and so on and so forth, until the combined secondary emission is of the desired light spectrum. The secondary emission resulting from this embodiment may be a combined full spectrum white light source, as shown in FIG. 11a. Alternatively, the secondary emission resulting from this embodiment may be any desired light spectrum by adjusting the selection, positioning, and parameters of the individual crystalline phosphor substrate layers and/or by adjusting the excitation source.

FIG. 11b provides an example of the tunable light synthesizer system in which the first crystalline phosphor substrate layer has been rotationally adjusted to emit secondary light emission $\lambda_1$ in the direction of a fourth crystalline phosphor substrate layer 10d, bypassing individual crystalline phosphor substrate layers 10b and 10c. In this manner, the combined secondary emissions from the light system may be a colored light emission of any desired quality ($\lambda_1+...\lambda_n$). Accordingly the pathway of the excited and/or converted may be adjusted to produce light emissions of any desired quality. The outputs of each of these pathways may produce secondary emissions of different parameters, depending on the compositions of the individual layers and the dopants used, as well as by the number of layers through which the light is converted and reflected. As would be appreciated by one having ordinary skill in the art, the excitation source and/or the individual crystalline phosphor substrate layers may be rotated, tilted, or positioned in a number of other configurations to provide the directional pathway for the excited and/or converted light emissions. FIG. 11b shows a configuration wherein by rotating the orientation of one or more of the phosphor plates, one can synthesize any desirable spectrum as needed. Such a system can be manufactured in compact form by, for example, using micro-electro-mechanical mirrors (MEMS) integrated with the crystalline phosphor substrate layers.

As discussed above, the crystalline phosphor substrate may include one or more layers or regions, with each having the same or different type of phosphor material, dopant, density, crystal size, and other crystalline parameters. The composition of each layer or region exhibits excitation in the blue and/or ultraviolet emission spectrum, provides a desirable peak emission, and has efficient light conversion. For example, in one embodiment a first layer or region of the crystalline phosphor substrate comprises yttrium aluminum garnet (YAG, with chemical formula $Y_3Al_5O_{12}$). The YAG layer or region is known to be a stable compound that is mechanically robust, physically hard, and optically isotropic. This first layer may be combined with other compounds to achieve the desired emission wavelength. In one embodiment where the single crystalline phosphor substrate absorbs blue light and re-emits yellow, the single crystalline phosphor substrate can comprise YAG:Ce. This embodiment is particularly applicable to LEDs that emit a white light combination of blue and yellow light. In other embodiments, other phosphor compounds can be deposited upon the YAG layer for absorption and down-conversion of different wavelengths of light.

As stated above, the phosphor materials may be graded, for examples, regions of varying densities, crystal sizes, and other crystallography parameters. These parameters may provide a gradient that is linear, parabolic, or any other function or shape. The gradation can also be in a number of different directions or configurations, as would readily be appreciated by one having ordinary skill in the art. In addition to the phosphor materials being capable of gradations, the doping concentration of the active element (i.e., dopant) can be graded. The dopant can be graded vertically through the thickness of the layer or region, laterally along the width of the layer or region, or a combination of both. As would be appreciated by one having ordinary skill in the art, the dopant gradient can be linear, parabolic, or any other function or shape. Thus the crystalline phosphor substrate may include one type of phosphor material having the uniform density, crystal size, and other crystallography parameters, and be doped with one type of dopant, but still have a number of regions or layers due to the dopant gradient.

FIGS. 8a and 8b show two possible embodiments of the substrates manufactured according to the methods of the present invention. FIG. 8a shows a crystalline phosphor substrate having a phosphor composition gradient. The phosphor material employed in this embodiment is an alkaline earth metal thiogallate having the formula: $Ba_xSr_yCa_zGa_rS_q$: $(Eu^{2+})_t$; where x ranges from about 1 to about 0, y ranges from about 0 to about 1; z ranges from about 0 to about 1, r ranges from about 2 to about 0, q ranges from about 4 to about 1, and t remains constant at about 0.02. Accordingly, while the composition of the phosphor material in the crystalline phosphor substrate shown in FIG. 8a changes to produce a phosphor composition gradient, the dopant remains constant. Alternatively, FIG. 8b shows a crystalline phosphor substrate having a dopant gradient. The phosphor material employed in this embodiment is again an alkaline earth metal thiogallate. More specifically, the alkaline earth metal thiogallate employed has the formula: $Ba_xSr_yCa_zGa_rS_q$: $(Ca^{3+})_t(Eu^{2+})_w(Mn^{2+})_v$; where x, y, and z remain constant at about 0.33, r remains constant at about 2, q remains constants at about 4, t ranges from about 0.03 to about 0, w ranges from about 0 to about 0.02, and v ranges from about 0 to about 0.01. Accordingly, while the composition of the phosphor material in the crystalline phosphor substrate shown in FIG. 8a remains constant, the dopant changes to produce a dopant gradient. As discussed above, other embodiments may include one or more phosphor materials in a first substrate layer or region, optionally one or more additional phosphor material layers or regions, and optionally one or more dopants in each of the first substrate layer and the additional phosphor material layers.

In a further embodiment, the present invention provides a light system comprising an excitation source for emitting short wavelength primary emissions; and a down-conversion substrate disposed in the path of at least some of the primary emissions from the excitation source to convert at least a portion of the primary emissions into longer-wavelength secondary emissions, wherein the substrate comprises one or more crystallography layers, wherein each crystallography layer comprises one or more phosphor materials, and optionally at least one activator. The excitation source may be disposed, for example, adjacent to, remote from, or embedded within the substrate. As would be appreciated by one having ordinary skill in the art, additional components may be employed to enhance the directional light output, aesthetics, or light quality of the light systems of the present invention including, for example, mirrors, diffraction gratings, integration lenses, and light guides. Similarly, the position of these components may be adjusted to ensure the desired light output and visual effect. For example, at least one diffraction grating disposed on a side of the substrate opposite the excitation source. Optic elements and/or heat sinks may be utilized to reduce and/or redistribute light and/or heat at the light system. All of these structural parameters and features are contemplated by the embodiments of the present invention.

The light system may be used to produce a variety of light emissions. For example, the light system may be configured to produce a colored light or a full spectrum white light, from the top, bottom, or perimeter sides of the substrate. Additionally or alternatively, the light system may be configured to emit light at a desired longer-wavelength emission when excited along the crystallography layer. In this manner, the layer or layers of the substrate act as light guides for down-converted emissions of a particular wavelength. Additionally, the substrate may be configured to have any range of optical transmissiveness, ranging from, for example, opaque to entirely transmissive. The substrate may be preferably configured to have an optical transmission greater than 90%. While the present invention provides examples of light source in the human eye sensitivity range (i.e., visible light spectrum), the concept is universally applicable for infrared and ultraviolet regions of the spectrum and associated applications such as biochemical sensing, plant growth, tunable heat source for medical therapy, etc.

EXAMPLE

The invention will now be described by use of a non-limiting example. It will be understood that any number of the materials, substrates, systems, and the like described above may be used or configured in a number of different ways and be within the teachings of the present invention.

Figure 9:
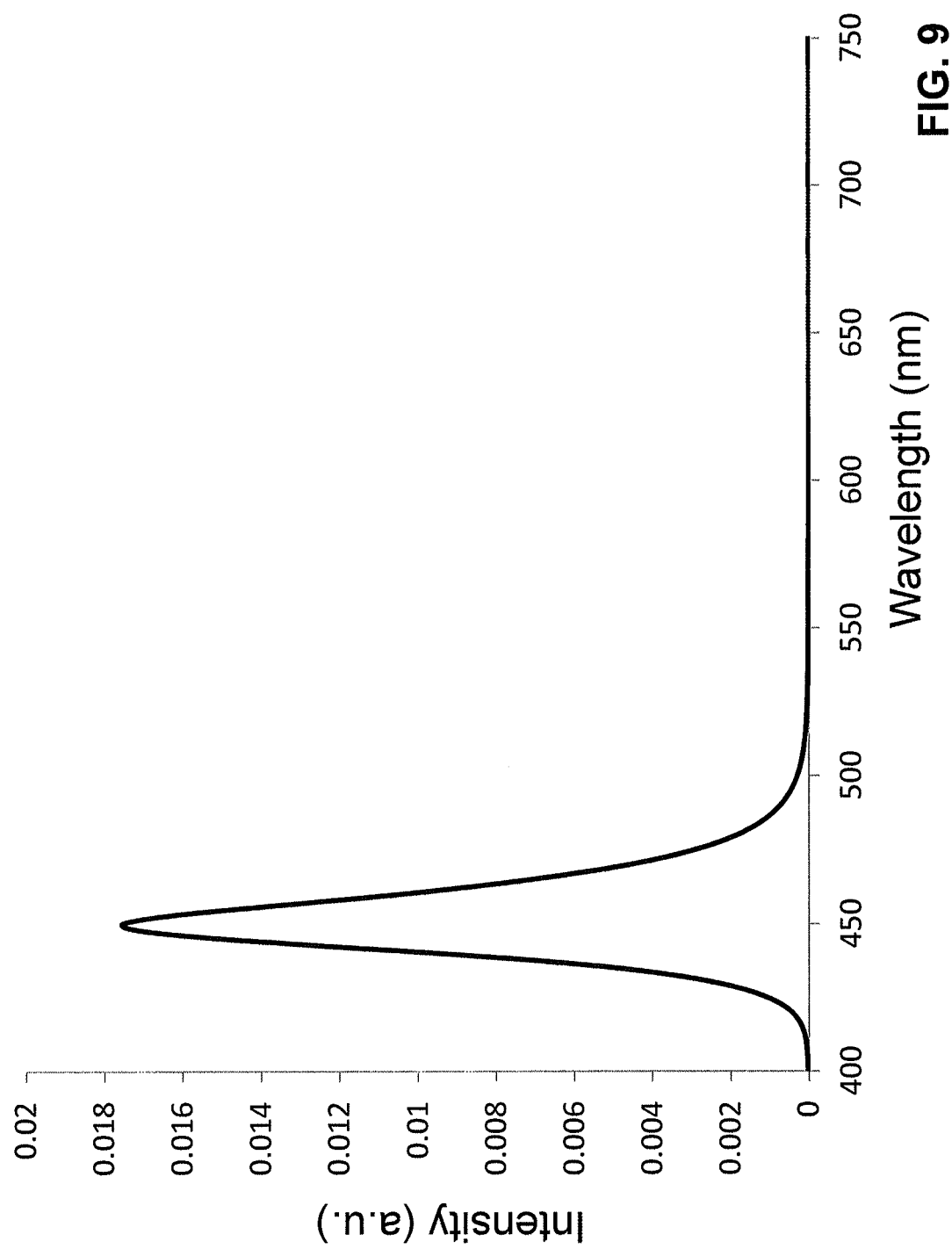
FIG. 9 shows a plot of the emission spectrum from a typical blue LED excitation source.
Figure 10:
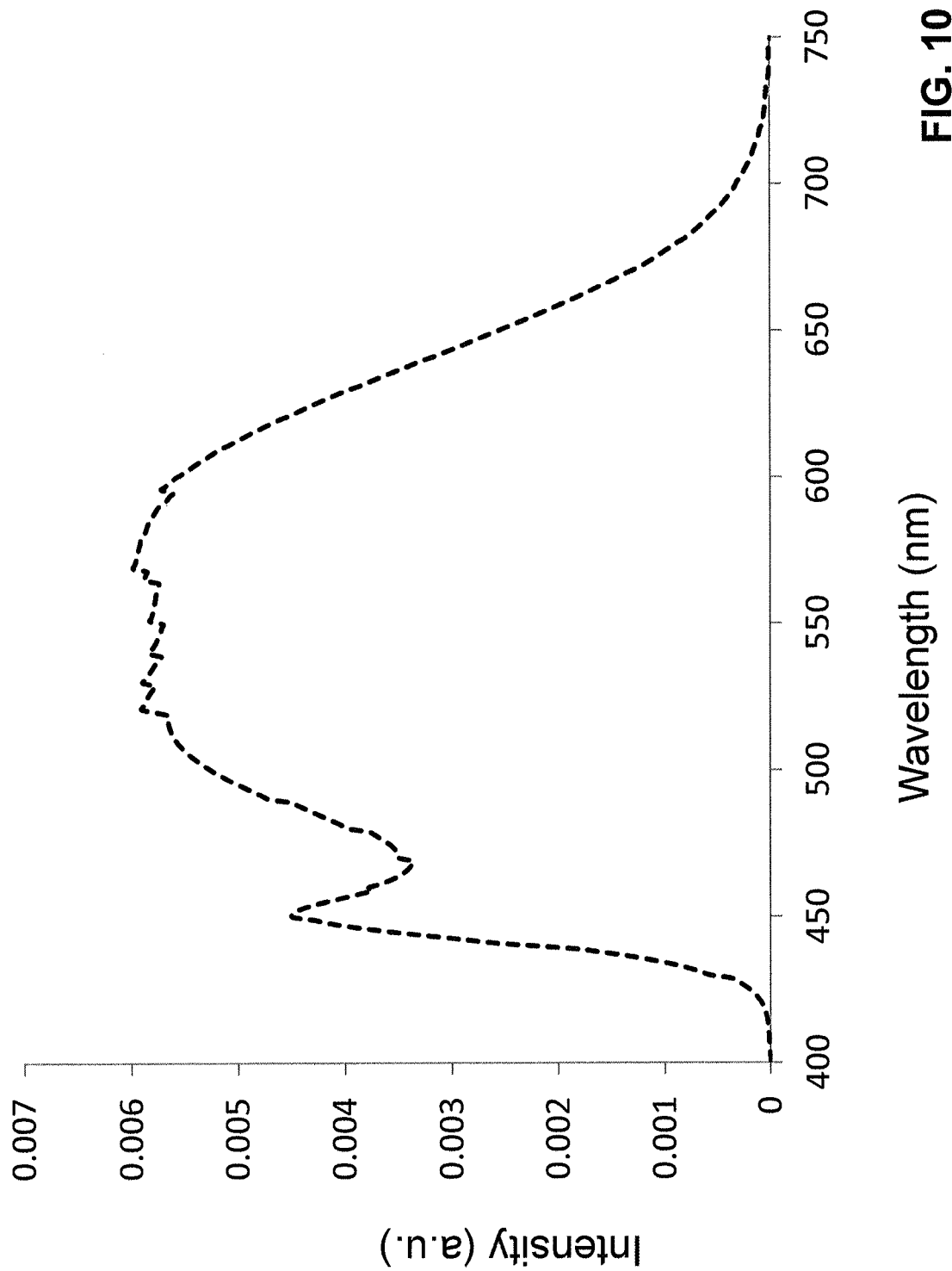
FIG. 10, comparatively, shows a plot of the emission spectrum from a typical blue LED excitation source that has been passed through a graded crystalline phosphor substrate according to at least one embodiment of the present invention.

FIG. 9 shows a plot of the emission spectrum from a typical blue LED excitation source. As can be seen from the figure, the blue LED produces a limited wavelength emission range around 450 nm. FIG. 10, comparatively, shows a plot of the emission spectrum from a typical blue LED excitation source that has been passed through a graded crystalline phosphor substrate according to at least one embodiment of the present invention. The crystalline phosphor substrate tested was a graded composition of an alkaline earth metal thiogallate which typically has the formula $M_xM_yA_{2a}A_{2b}S_4$: $Eu^{2+}$; where M is one or more elements selected from the group consisting of Be, Mg, Ca, Sr, Ba, and Zn; and A is one or more elements from Al, Ga, In, Y, La, Gd. Specifically, the alkaline earth metal thiogallate employed had the formula: (SrCa)(GaIn)$_2$S$_4$: Eu$^{2+}$. As can be seen from the figure, the emission spectrum after it has passed through a graded crystalline phosphor substrate indicates a broad range of high intensity wavelengths, ranging from about 400 nm to about 700 nm, and more particularly from about 450 nm to about 650 nm. As would be appreciated by one having ordinary skill in the art, FIG. 10 shows that a full spectrum white light can be achieved by the embodiments of the present invention.

Accordingly the embodiments of the present invention may be utilized to produce a full spectrum broad wavelength emission white light source fabricated using crystalline phosphor substrates. The present invention also enables high efficiency, high flux, narrow or wide spectral width, large area, low cost LEDs with peak emission wavelength in the range of visible wavelength range from 400-750 nm. The crystalline phosphor substrates are capable of being optically clear, i.e., entirely transmissive, or have any desired about of transparency or opacity. The present invention also utilizes crystal growth processes from melts which are known to deliver high quality crystalline materials, and can be fabricated using simplified cost-effective manufacturing processes. The present invention thus provides a platform technology and pathway for rapid development of LEDs which are capable of down-converting and emitting a multitude of emission wavelengths across the entire visible range. The availability of such LEDs with a multitude of emission wavelengths, which may be excited by commercially-available blue or ultraviolet LEDs, will accelerate the development and deployment of smart lighting and display systems among other optics technologies. All of these desirable characteristics of substrates and light systems are enabled by the simultaneous tuning of various properties such as emission wavelength, spectral width, and polarization, over a large area, by single phase crystallography of the phosphor materials and the correlation between the crystallographic phases and the emission properties of the films.

It will be understood that the geometries of the substrates, phosphor plates, and light systems of the present invention are not limited to the specific shapes shown in the Figures, described above, or presented in the Examples. Alternate shapes may be used to achieve specific performance or aesthetics, while addressing other design concerns, such as light color. Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A method of manufacturing a down-conversion substrate for use in a light system, the method comprising:
    forming a first crystallography layer comprising one or more phosphor materials and, optionally, applying at least one activator to the crystallography layer;
    heating the crystallography layer at a temperature to promote crystal growth in the crystallography layer; and
    drawing out the crystallography layer and allowing the crystallography layer to cool to form the down-conversion substrate.

2. The method of claim 1, further comprising depositing one or more additional crystallography layers comprising one or more phosphor materials upon the first crystallography layer and, optionally, applying at least one activator to each of the one or more additional crystallography layers.

3. The method of claim 1, wherein the first crystallography layer is formed by gradually adding the phosphor materials into a molten compound, depositing phosphor materials by vapor phase layer deposition, depositing organic precursors, or depositing phosphor materials by atomic layer deposition.

4. The method of claim 1, wherein the crystallography layer comprises a graded phosphor material.

5. The method of claim 1, wherein the activator is a dopant selected from the group consisting of samarium (Sm), dysprosium (Dy), europium (Eu), cerium (Ce), praseodymium (Pr), terbium (Tb), holmium (Ho), neodymium (Nd), erbium (Er), and mixtures thereof.

6. The method of claim 2, wherein the first crystallography layer and the one or more additional crystallography layers each comprise the same phosphor material.

7. The method of claim 6, wherein each activator is a different dopant selected from the group consisting of samarium (Sm), dysprosium (Dy), europium (Eu), cerium (Ce), praseodymium (Pr), terbium (Tb), holmium (Ho), neodymium (Nd), erbium (Er), and mixtures thereof.

8. The method of claim 2, wherein each crystallography layer is configured to emit light at a desired wavelength emission when emitted through an edge of the layer and wherein the wavelength emission obtained by passing through each crystallography layer may be combined to produce a white light of any desired intensity.

9. The method of claim 1, wherein the one or more phosphor materials are selected to create a crystallography layer from the group consisting of yttrium aluminum garnet, silicate garnet, vanadate garnet, mixed oxides, alkaline earth metal silicates, alkaline earth metal sulfides and selenides, alkaline earth metal thiogallates, metal nitrides, metal oxonitrides, and mixed molybdate-tungstate families, and mixed glass phosphors, and mixtures thereof.

10. The method of claim 1, wherein the crystallography layer consists of an alkaline earth metal thiogallates having the formula:

$$M_xM_yA_{2a}A_{2b}S_4:Eu^{2+};$$

$$MA_2(S_xSe_y)_4:B;$$

$$MA_4(S_xSe_y)_7:B;$$

$$M_2A_4(S_xSe_y)_7:B; \text{ or}$$

$$(M1)_m(M2)_nA_p(S_xSe_y)_q;$$

where M, M1, and M2 are one or more elements selected from the group consisting of Be, Mg, Ca, Sr, Ba, and Zn; A are one or more elements from Al, Ga, In, Y, La, Gd; B is an element from Eu, Ce, Cu, Ag, Al, Tb, Cl, Br, F, I, Mg, Pr, K, Na, Mn; a, b, m, n, x, and y are values between 0 and 1; p is about 2 or about 4; and q is about 4 or about 7.

11. The method of claim 2, wherein the one or more crystallography layers comprises a graded phosphor layer and the activator is a dopant, wherein the graded phosphor layer comprises one or more of strontium, calcium, gallium, indium, and sulfur, and mixtures thereof; and wherein the dopant is europium.

12. The method of claim 11, wherein the graded phosphor layer and the activator are selected to form (SrCa)(GaIn)$_2$S$_4$:Eu$^{2+}$.

13. The method of claim 2, wherein the one or more crystallography layers consist of quantum dots of one or more sizes.

* * * * *

UNITED STATES PATENT AND TRADEMARK OFFICE
CERTIFICATE OF CORRECTION

PATENT NO. : 9,722,154 B2
APPLICATION NO. : 13/808923
DATED : August 1, 2017
INVENTOR(S) : Partha S. Dutta It is certified that error appears in the above-identified patent and that said Letters Patent is hereby corrected as shown below:

In the Specification

Column 1, Line 5, insert:
-- STATEMENT REGARDING FEDERALLY SPONSORED RESEARCH
This invention was made with government support under Contract Agreement No. NSF EEC0812056 awarded by the National Science Foundation. The Government has certain rights in this invention. --

Signed and Sealed this
Third Day of October, 2017

Joseph Matal
*Performing the Functions and Duties of the*
*Under Secretary of Commerce for Intellectual Property and*
*Director of the United States Patent and Trademark Office*